US011042093B2

(12) United States Patent
Cameron et al.

(10) Patent No.: US 11,042,093 B2
(45) Date of Patent: Jun. 22, 2021

(54) GAP-FILLING METHOD

(71) Applicant: Rohm and Haas Electronic Materials LLC, Marlborough, MA (US)

(72) Inventors: James F. Cameron, Brookline, MA (US); Keren Zhang, Shrewsbury, MA (US); Li Cui, Westborough, MA (US); Daniel Greene, Shrewsbury, MA (US); Shintaro Yamada, Shrewsbury, MA (US)

(73) Assignee: Rohm and Haas Electronic Materials LLC, Marlborough, MA (US)

( * ) Notice: Subject to any disclaimer, the term of this patent is extended or adjusted under 35 U.S.C. 154(b) by 200 days.

(21) Appl. No.: 16/167,568

(22) Filed: Oct. 23, 2018

(65) Prior Publication Data

US 2019/0146346 A1 May 16, 2019

Related U.S. Application Data

(60) Provisional application No. 62/586,298, filed on Nov. 15, 2017.

(51) Int. Cl.
*G03F 7/20* (2006.01)
*C08G 61/10* (2006.01)
*G03F 7/09* (2006.01)

(52) U.S. Cl.
CPC ........... *G03F 7/2012* (2013.01); *C08G 61/10* (2013.01); *G03F 7/094* (2013.01); *C08G 2261/222* (2013.01); *C08G 2261/226* (2013.01); *C08G 2261/312* (2013.01); *C08G 2261/46* (2013.01); *C08G 2261/51* (2013.01)

(58) Field of Classification Search
None
See application file for complete search history.

(56) References Cited

U.S. PATENT DOCUMENTS

| | | | |
|---|---|---|---|
| 6,790,792 B2 | 9/2004 | Shaffer, II et al. | |
| 2002/0052125 A1* | 5/2002 | Shaffer, II | H01L 21/76813 438/780 |
| 2004/0126586 A1 | 7/2004 | Hedrick et al. | |
| 2009/0081377 A1 | 3/2009 | Kubo | |
| 2018/0162968 A1* | 6/2018 | Kinzie | C08L 45/00 |
| 2018/0233360 A1* | 8/2018 | Sankarapandian | H01L 21/0276 |

FOREIGN PATENT DOCUMENTS

| | | |
|---|---|---|
| JP | 2000191752 A | 7/2000 |
| WO | 2005030830 A1 | 4/2005 |
| WO | 2005030848 A1 | 4/2005 |

* cited by examiner

*Primary Examiner* — Kathleen Duda
(74) *Attorney, Agent, or Firm* — Jonathan D Baskin

(57) ABSTRACT

A method of manufacturing a semiconductor device comprising: providing a semiconductor device substrate having a relief image on a surface of the substrate, the relief image having a plurality of gaps to be filled; applying a coating composition to the relief image to provide a coating layer, wherein the coating composition comprises (i) a polyarylene oligomer comprising as polymerized units one or more first monomers having two or more cyclopentadienone moieties and one or more second monomers having an aromatic moiety and two or more alkynyl moieties; wherein the polyarylene oligomer has a $M_w$ of 1000 to 6000 Da, a PDI of 1 to 2, and a molar ratio of total first monomers to total second monomers of 1:>1; and (ii) one or more organic solvents; curing the coating layer to form a polyarylene film; patterning the polyarylene film; and transferring the pattern to the semiconductor device substrate.

10 Claims, No Drawings

GAP-FILLING METHOD

The present invention relates generally to the field of polyarylene materials and more particularly to polyarylene oligomers for use in electronics applications.

It is well-known in lithographic processes that a resist pattern can collapse due to surface tension from the developer used if the resist pattern is too tall (high aspect ratio). Multilayer resist processes (such as three- and four-layer processes) have been devised which can address this issue of pattern collapse where a high aspect ratio is desired. Such multilayer processes use a resist top layer, one or more middle layers, and a bottom layer (or underlayer). In such multilayer resist processes, the top photoresist layer is imaged and developed in typical fashion to provide a resist pattern. The pattern is then transferred to the one or more middle layers, typically by etching. Each middle layer is selected such that a different etch process is used, such as different plasma etches. Finally, the pattern is transferred to the underlayer, typically by etching. Such middle layers may be composed of various materials while the underlayer materials are typically composed of high carbon content materials. The underlayer material is selected to provide desired antireflective properties, planarizing properties, as well as etch selectivity.

The incumbent technologies for underlayer include chemical vapor deposited (CVD) carbon and solution processed high-carbon content polymers. The CVD materials have several significant limitations including high cost of ownership, inability to form a planarizing layer over topography on a substrate, and high absorbance at 633 nm which is used for pattern alignment. For these reasons, the industry has been moving to solution processed high-carbon content materials as underlayers. The ideal underlayer needs to meet the following properties: capable of being cast onto a substrate by a spin-coating process, thermal-set upon heating with low out-gassing and sublimation, soluble in common processing solvents for good equipment compatibility, have appropriate n/k ratio to work in conjunction with currently used silicon hardmask and bottom antireflectant (BARC) layers to impart low reflectivity necessary for photoresist imaging, and be thermally stable up to >400° C. so as to not be damaged during subsequent silicon-oxy-nitride (SiON) CVD processes.

It is well-known that materials of relatively low molecular weight have relatively low viscosity, and flow into features in a substrate, such as vias and trenches, to afford planarizing layers. Underlayer materials must be able to planarize with relatively low out-gassing up to 400° C. For use as a high-carbon content underlayer, it is imperative for any composition to be thermally set upon heating. However, such relatively low molecular weight crosslinking additives are prone to undesired out-gassing or sublimation during the curing process.

U.S. Published Pat. App. No. 2009/0081377 discloses a film forming composition having a photoacid generator and a crosslinked or crosslinkable polyphenylene that is a Diels-Alder reaction between a compound having two or more diene groups and a compound having two or more dienophile groups. This published patent application discloses biscyclopentadienones as suitable compounds having two or more diene groups and polyfunctional acetylenes as compounds having two or more dienophile groups. These film forming compositions show improved mechanical strength and are disclosed for use in forming various permanent integrated dielectric layers in an integrated circuit.

Polyarylene polymers, such as those disclosed in U.S. Published Pat. App. No. 2009/0081377, are well-known as dielectric materials and possess many desirable properties. However, polyarylene oligomers are known to suffer from limited solubility in organic solvents conventionally used in the electronics industry, limiting the use of these polymers. For example, one commercial polyarylene polymer available from The Dow Chemical Company under the tradename SiLK™ G is prepared from a Diels-Alder polymerization of a certain biscyclopentadienone monomer and a certain polyethynyl-substituted aromatic compound in a molar ratio of 1:<1, and has a $M_w$ of approximately 3000-3500 and a PDI of approximately 1.3, suffers from limited solubility in organic solvents conventionally used in the electronics industry. Attempts have been made to improve the solubility of such Diels-Alder polymerized polyarylene polymers. For example, U.S. Published Pat. App. No. 2016/0060393, discloses polar moiety-terminated polyarylene oligomers and U.S. Published Pat. App. No. 2017/0009006 discloses certain polar moiety-containing polyarylene polymers which contain repeating units having one or more polar moieties. Such polar moiety-containing polyarylene polymers do have improved solubility in certain organic solvents as compared to conventional polyarylene polymers, however the numerous polar moieties contained in these polymers may adversely impact other desired properties of the polymers such as film shrinkage upon heating, dielectric constant, and water absorption.

There remains a need in the industry for organic gap-filling materials that are sufficiently soluble in organic solvents conventionally used in spin-coating to cast polymer films, that fill gaps void-free, that do not out-gas, and that form cured films that are stable at processing temperatures >400° C.

The present invention provides a method comprising: (a) providing a semiconductor device substrate having a relief image on a surface of the substrate, the relief image having a plurality of gaps to be filled; (b) applying a coating composition to the relief image and filling the gaps to provide a coating layer, wherein the coating composition comprises (i) a polyarylene oligomer comprising as polymerized units one or more first monomers having two or more cyclopentadienone moieties and one or more second monomers having an aromatic moiety and two or more alkynyl moieties; wherein the polyarylene oligomer has a $M_w$ of 1000 to 6000 Da, a PDI of 1 to 2, and a molar ratio of total first monomers to total second monomers of 1:>1; and (ii) one or more organic solvents; (c) curing the coating layer to form a polyarylene film; (d) disposing a layer of an inorganic hardmask on the polyarylene film; (e) disposing a layer of a photoresist on the inorganic hardmask layer; (f) patterning the photoresist layer, (g) transferring the pattern from the photoresist layer to the polyarylene film; and (h) then transferring the pattern to the semiconductor device substrate.

Also provided by the present invention is a composition comprising a polyarylene oligomer and an organic solvent; wherein the polyarylene oligomer comprises as polymerized units one or more first monomers having two or more cyclopentadienone moieties, one or more second monomers having an aromatic moiety and two or more alkynyl moieties, and one or more end-capping monomers having one dienophilic moiety; wherein the polyarylene oligomer has a $M_w$ of 1000 to 6000 Da, a PDI of 1 to 2, and a molar ratio of total first monomers to total second monomers of 1:>1.

As used throughout this specification, the following abbreviations shall have the following meanings, unless the context clearly indicates otherwise: ° C.=degree Celsius; g=gram; mg=milligram; L=liter, mL=milliliter, Å=angstrom; nm=nanometer; μn=micron=micrometer, mm=millimeter, sec.=second; min.=minute; hr.=hour; DI=deionized; ca.=approximately; and Da=dalton. Unless otherwise specified, all amounts are percent by weight ("wt %") and all ratios are molar ratios. All numerical ranges are inclusive and combinable in any order, except where it is clear that such numerical ranges are constrained to add up to 100%. The articles "a", "an" and "the" refer to the singular and the plural. "Alkyl" refers to linear, branched and cyclic alkyl unless otherwise specified. "Alkyl" refers to an alkane radical, and includes alkane monoradicals, diradicals (alkylene), and higher-radicals. "Halo" refers to fluoro, chloro, bromo, and iodo. When an element is referred to as being "on" another element, it can be directly on the other element or intervening elements may be present therebetween. In contrast, when an element is referred to as being "directly on" another element, there are no intervening elements present. As used herein, "gap" refers to any aperture on a semiconductor substrate, such as trenches, holes, spacing between lines, and the like, that is intended to be filled with the present coating composition.

As used herein, an "optionally substituted" moiety refers to both an unsubstituted moiety and a substituted moiety, for example, "optionally substituted aryl" refers to both unsubstituted aryl and substituted aryl. When a moiety is not described as "substituted" herein, such moiety will refer to an "unsubstituted" moiety unless the context clearly indicates otherwise. Preferably, a substituted aryl has from 1 to 3 substituents, and more preferably 1 or 2 substituents. It will be appreciated by those skilled in the art that where the number of substituents on an aromatic ring in any of the formulas contained herein is less than the number of possible substituents, that the remaining aromatic atoms are substituted with hydrogen. "Aryl" refers to aromatic carbocycles and aromatic heterocycles. The term "aryl" refers to an aromatic radical, and includes monoradicals, diradicals (arylene), and higher-radicals. It is preferred that aryl moieties are aromatic carbocycles. The term "oligomer" refers to dimers, trimers, tetramers and other relatively low molecular weight polymeric materials (i.e., having a $M_w$ of ≤10 kDa, and preferably ≤6 kDa) that are capable of further curing. By the term "curing" is meant any process, such as polymerization or condensation, that increases the overall molecular weight of the present oligomers. "Curable" refers to any material capable of being cured under certain conditions.

Polyarylene oligomers of the present invention comprise polymerized units of one or more first monomers having two or more cyclopentadienone moieties and one or more second monomers having an aromatic moiety and two or more alkynyl moieties. Optionally, one or more first monomers and/or the one or more second monomers may be substituted with one or more solubility enhancing polar moieties, such as those solubility enhancing moieties disclosed in U.S. Published Pat. App. No. 2017/0009006. Suitable solubility enhancing polar moieties include, without limitation: hydroxyl, carboxyl, thiol, nitro, amino, amido, sulfonyl, sulfonamide moieties, ester moieties, quaternary amino moieties, and the like. Exemplary first monomers having one or more solubility enhancing polar moieties are disclosed in U.S. patent application Ser. No. 15/790,606, filed on Oct. 27, 2017. Exemplary second monomers having one or more solubility enhancing polar moieties are those disclosed in U.S. Published Pat. App. No. 2017/0009006. Preferably, the one or more first monomers are free of solubility enhancing polar moieties. Preferably, the one or more second monomers are free of solubility enhancing polar moieties. More preferably, both the more first monomers and second monomers are free of solubility enhancing polar moieties.

Any compound containing two or more cyclopentadienone moieties capable of undergoing a Diels-Alder reaction may suitably be used as the first monomer to prepare the present polyarylene oligomers. Alternatively, a mixture of two or more different first monomers, each having two or more cyclopentadienone moieties, may be used as the first monomer. Preferably, only one first monomer is used. Preferably, the first monomer has two to four cyclopentadienone moieties, and more preferably two cyclopentadienone moieties (also referred to herein as biscyclopentadienones). Suitable first monomers having two or more cyclopentadienone moieties are well-known in the art, such as those described in U.S. Pat. Nos. 5,965,679; 6,288,188; and 6,646,081; and in Int. Pat. Pubs. WO 97/10193, WO 2004/073824 and WO 2005/030848.

It is preferred that the first monomer has the structure shown in formula (1)

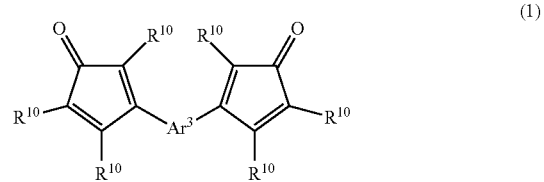

wherein each $R^{10}$ is independently chosen from H, $C_{1-6}$-alkyl, and optionally substituted $C_{5-20}$-aryl; and $Ar^3$ is an aryl moiety having from 5 to 60 carbons. In formula (1), "substituted $C_{5-20}$-aryl" refers to a $C_{5-20}$-aryl having one or more of its hydrogens replaced with one or more of halogen, $C_{1-10}$-alkyl, $C_{5-10}$-aryl, —C≡C—$C_{5-10}$-aryl, or a heteroatom-containing radical having from 0 to 20 carbon atoms and one or more heteroatoms chosen from O, S and N, preferably from halogen, $C_{1-10}$-alkyl, $C_{6-10}$-aryl, and —C≡C—$C_{6-10}$-aryl, and more preferably from phenyl and —C≡C-phenyl. As used herein, "substituted phenyl" refers to a phenyl moiety substituted with one or more of halogen, $C_{1-10}$-alkyl, $C_{5-10}$-aryl, —C≡C—$C_{5-10}$-aryl, or a heteroatom-containing radical having from 0 to 20 carbon atoms and one or more heteroatoms chosen from O, S and N, and preferably with one or more of halogen, $C_{1-10}$-alkyl, $C_{6-10}$-aryl, and —C≡C—$C_{6-10}$-aryl, and more preferably from phenyl and —C≡C-phenyl. Exemplary heteroatom-containing radicals having from 0 to 20 carbon atoms and one or more heteroatoms chosen from O, S and N include, without limitation, hydroxy, carboxy, amino, $C_{1-20}$-amido, $C_{1-10}$-alkoxy, $C_{1-20}$-hydroxyalkyl, $C_{1-30}$-hydroxy(alkyleneoxy), and the like. Preferably, each $R^{10}$ is independently chosen from $C_{1-6}$-alkyl, phenyl and substituted phenyl, more preferably each $R^{10}$ is phenyl or substituted phenyl, and yet more preferably phenyl or —$C_6H_4$—C≡C-phenyl. A wide variety of aromatic moieties are suitable for use as $Ar^3$, such as those disclosed in U.S. Pat. No. 5,965,679. Preferably, $Ar^3$ has from 5 to 40 carbons, and more preferably from 6 to 30 carbons. Preferred aryl moieties useful for $Ar^3$ include pyridyl, phenyl, naphthyl, anthracenyl, phenanthryl, pyrenyl, coronenyl, tetracenyl, pentacenyl, tetraphenyl, benzotetracenyl, triphenylenyl, perylenyl, biphenyl, binaphthyl, diphenyl ether, dinaphthyl ether, and those having the structure shown in formula (2)

wherein x is an integer chosen from 1, 2 or 3; y is an integer chosen from 0, 1, or 2; each $Ar^4$ is independently chosen from

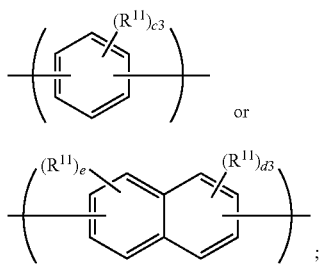

each $R^{11}$ is independently chosen from halogen, $C_{1-6}$-alkyl, $C_{1-6}$-haloalkyl, $C_{1-6}$-alkoxy, $C_{1-6}$-haloalkoxy, phenyl, and phenoxy; c3 is an integer from 0 to 4; each of d3 and e is an integer from 0 to 3; each Z is independently chosen from a single covalent chemical bond, O, S, $NR^{12}$, $PR^{12}$, $P(=O)R^{12}$, $C(=O)$, $C(R^{13})(R^{14})$, and $Si(R^{13})(R^{14})$; $R^{12}$, $R^{13}$, and $R^{14}$ are independently chosen from H, $C_{1-4}$-alkyl, $C_{1-4}$-haloalkyl, and phenyl. It is preferred that x is 1 or 2, and more preferably 1. It is preferred that y is 0 or 1, and more preferably 1. Preferably, each $R^{11}$ is independently chosen from halogen, $C_{1-4}$-alkyl, $C_{1-4}$-haloalkyl, $C_{1-4}$-alkoxy, $C_{1-4}$-haloalkoxy, and phenyl, and more preferably from fluoro, $C_{1-4}$-alkyl, $C_{1-4}$-fluoroalkyl, $C_{1-4}$-alkoxy, $C_{1-4}$-fluoroalkoxy, and phenyl. It is preferred that c3 is from 0 to 3, more preferably from 0 to 2, and yet more preferably 0 or 1. It is preferred that each of d3 and e is independently 0 to 2, and more preferably 0 or 1. In formula (4), it is preferred that d3+e=0 to 4, and more preferably 0 to 2. Each Z is preferably independently chosen from O, S, $NR^{12}$, $C(=O)$, $C(R^{13})(R^{14})$, and $Si(R^{13})(R^{14})$, more preferably from O, S, $C(=O)$, and $C(R^{13})(R^{14})$, and yet more preferably from O, $C(=O)$, and $C(R^{13})(R^{14})$. It is preferred that each $R^{12}$, $R^{13}$, and $R^{14}$ are independently chosen from H, $C_{1-4}$-alkyl, $C_{1-4}$-fluoroalkyl, and phenyl; and more preferably from H, $C_{1-4}$-alkyl, $C_{1-2}$-fluoroalkyl, and phenyl. Preferably, the aryl moiety of $Ar^3$ has at least one ether linkage, more preferably at least one aromatic ether linkage, and even more preferably one aromatic ether linkage. It is preferred that $Ar^3$ has the structure of formula (2). Preferably, each $Ar^4$ has the formula (3), and more preferably each $Ar^4$ has the formula 3 and Z is O.

Any compound having an aryl moiety and two or more alkynyl groups capable of undergoing a Diels-Alder reaction may suitably be used as the second monomer to prepare the present oligomers. Preferably, the second monomer has an aryl moiety substituted with two or more alkynyl groups. It is preferred that a compound having an aryl moiety substituted with two to four, and more preferably two or three, alkynyl moieties is used as the second monomer. Preferably, the second monomers have an aryl moiety substituted with two or three alkynyl groups capable of undergoing a Diels-Alder reaction. Suitable second monomers are those of formula (5)

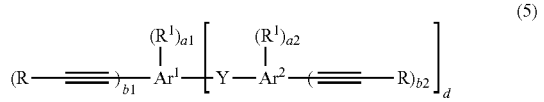

wherein each $Ar^1$ and $Ar^2$ is independently a $C_{5-30}$-aryl moiety; each R is independently chosen from H, and optionally substituted $C_{5-30}$-aryl; each $R^1$ is independently chosen from $C_{1-10}$-alkyl, $C_{1-10}$-haloalkyl, $C_{1-10}$-hydroxyalkyl, $C_{1-10}$-alkoxy, CN, and halo; each Y is independently a single covalent chemical bond or a divalent linking group chosen from —O—, —S—, —S(=O)—, —S(=O)—, —C(=O)—, —$(C(R^9)_2)_z$—, $C_{6-30}$-aryl, and —$(C(R^9)_2)_{z1}$—$(C_{6-30}$-aryl)-$(C(R^9)_2)_{z2}$—; each $R^9$ is independently chosen from H, hydroxy, halo, $C_{1-10}$-alkyl, $C_{1-10}$-haloalkyl, and $C_{6-30}$-aryl; a1=0 to 4; each a2=0 to 4; b1=1 to 4; each b2=0 to 2; a1+each a2=0 to 6; b1+each b2=2 to 6; d=0 to 2; z=1 to 10; z1=0 to 10; z2=0 to 10; and z1+z2=1 to 10. Each R is preferably independently chosen from H and $C_{6-20}$-aryl, more preferably from H and $C_{6-10}$ aryl, and yet more preferably from H and phenyl. It is preferred that each $R^1$ is independently chosen from $C_{1-10}$-alkyl, $C_{1-10}$-haloalkyl, $C_{1-10}$-hydroxyalkyl, $C_{1-10}$-alkoxy, and halo, and more preferably from $C_{1-10}$-alkyl, $C_{1-10}$-haloalkyl, and halo. Preferably, each Y is independently a single covalent chemical bond or a divalent linking group chosen from —O—, —S—, —S(=O)—, —S(=O)—, —C(=O)—, —$(C(R^9)_2)_z$—, and $C_{6-30}$-aryl, and more preferably a single covalent chemical bond, —O—, —S—, —S(=O)$_2$—, —C(=O)—, and —$(C(R^9)_2)_z$—. Each $R^9$ is preferably independently H, halo, $C_{1-10}$-alkyl, $C_{1-10}$-haloalkyl, or $C_{6-30}$-aryl, and more preferably fluoro, $C_{1-6}$-alkyl, $C_{1-6}$-fluoroalkyl, or $C_{6-20}$-aryl. Preferably, a1=0 to 3, and more preferably 0 to 2. It is preferred that each a2=0 to 2. Preferably, a1+a2=0 to 4, more preferably 0 to 3, and yet more preferably 0 to 2. It is preferred that b1=1 to 3, and more preferably 1 or 2. It is preferred that each b2=0 to 2; and more preferably 0 or 1. Preferably, b1+each b2=2 to 4, and more preferably 2 or 3. It is preferred that d=0 or 1, and more preferably 0. Preferably, z=1 to 6, more preferably 1 to 3, and even more preferably z=1. Preferably, z1 and z2 are each 0 to 5. It is preferred that z1+z2=1 to 6, and more preferably 2 to 6.

Suitable aryl moieties for $Ar^1$ and $Ar^2$ include, but are not limited to, pyridyl, phenyl, naphthyl, anthracenyl, phenanthryl, pyrenyl, coronenyl, tetracenyl, pentacenyl, tetraphenyl, benzotetracenyl, triphenylenyl, perylenyl, biphenyl, binaphthyl, diphenyl ether, and dinaphthyl ether. It is preferred that $Ar^1$ and each $Ar^2$ in formula (5) are independently a $C_{6-20}$ aryl moiety. Preferred aryl moieties for $Ar^1$ and each $Ar^2$ are phenyl, naphthyl, anthracenyl, phenanthryl, pyrenyl, tetracenyl, pentacenyl, tetraphenyl, triphenylenyl, and perylenyl.

Preferred second monomers of formula (5) are those of formulas (6) and (7):

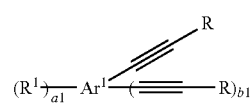

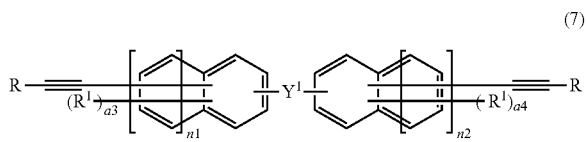

wherein $Ar^1$, R, $R^1$, a1 and b1 are as defined above for formula (5); a3 is 0 or 2; a4 is 0 to 2; each of n1 and n2 is independently 0 to 4; and $Y^1$ is a single covalent chemical bond, O, S, $S(=O)_2$, $C(=O)$, $C(CH_3)_2$, $CF_2$, and $C(CF_3)_2$. It will be appreciated by those skilled in the art that the brackets ("[ ]") in formula (7) refer to the number of aromatic rings fused to the phenyl ring. Accordingly, when n1 (or n2)=0, the aromatic moiety is phenyl; when n1 (or n2)=1, the aromatic moiety is naphthyl; when n1 (or n2)=2, the aromatic moiety may be anthracenyl or phenanthryl; when n1 (or n2)=3, the aromatic moiety may be tretacenyl, tetraphenyl, triphenylenyl, or pyrenyl; and when n1 (or n2)=4, the aromatic moiety may be perylenyl or benzotetracenyl. In formula (6), a1 is preferably 0 to 2, and more preferably 0. It is preferred that b1 in formula (6) is 1 or 2. R is preferably H or phenyl. Each $R^1$ in each of formulas (6) and (7) is preferably independently chosen from $C_{1-10}$-alkyl, $C_{1-10}$-haloalkyl, $C_{1-10}$-hydroxyalkyl, $C_{1-10}$-alkoxy, and halo, and more preferably from $C_{1-10}$-alkyl, $C_{1-10}$-haloalkyl, and halo. $Ar^1$ in formula (6) is preferably phenyl, naphthyl, anthracenyl, pyrenyl, and perylenyl, more preferably phenyl, naphthyl and pyrenyl, and even more preferably phenyl. In formula (7), it is preferred that n1 and n2 are independently chosen from 0, 1, 3, and 4, more preferably from 0, 1 and 3, and even more preferably from 1 and 3. It is further preferred that n1=n2. In formula (7), $Y^1$ is preferably a single covalent chemical bond, O, $S(=O)_2$, $C(=O)$, $C(CH_3)_2$, $CF_2$, or $C(CF_3)_2$, and more preferably a single covalent chemical bond.

Particularly preferred monomers of formula (6) are monomers of formulas (8) to (12):

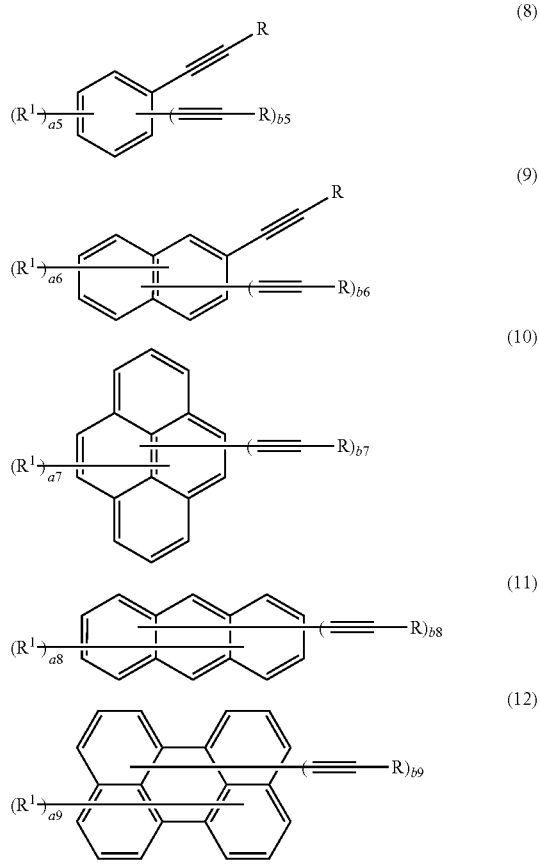

wherein R and $R^1$ are as described above for formula (6); a5=0 to 2; each of a6, a7, a8 and a9 are independently 0 to 4; b5 and b6 are each chosen from 1 to 3; and b7, b8, and b9 are each chosen from 2 to 4. Preferably, a5=0 or 1, and more preferably 0. It is preferred that a6 is 0 to 3, more preferably 0 to 2, and even more preferably 0. Preferably, each of a7 to a9 is independently 0 to 3, and more preferably 0 to 2. It is preferred that b5 and b6 are each chosen from 1 and 2. Preferably, b7, b8, and b9 are each 2 or 3. Compound (8) is more particularly preferred. Preferably, in compound (8), each R is independently H or phenyl, and more preferably each R is H or phenyl. More preferably, each $R^1$ in formulas (8) to (12) is independently chosen from $C_{1-10}$-alkyl, $C_{1-10}$-haloalkyl, $C_{1-10}$-hydroxyalkyl, $C_{1-10}$-alkoxy, and halo, and more preferably from $C_{1-10}$-alkyl, $C_{1-10}$-haloalkyl, and halo.

In the monomers of formulas (5) to (12), any two alkynyl moieties may have an ortho, meta or para relationship to each other, and preferably a meta or para relationship to each other. Preferably, the alkynyl moieties in the monomers of formulas (5) to (12) do not have an ortho relationship to each other. Suitable monomers of formulas (5) to (12) are generally commercially available or may be readily prepared by methods known in the art.

Exemplary second monomers include, without limitation: 1,3-diethynylbenzene; 1,4-diethynylbenzene; 4,4'-diethynyl-1,1'-biphenyl; 3,5-diethynyl-1,1'-biphenyl; 1,3,5-triethynylbenzene; 1,3-diethynyl-5-(phenylethynyl)benzene; 1,3-bis(phenylethynyl)benzene; 1,4-bis(phenylethynyl)benzene; 1,3,5-tris(phenylethynyl)benzene; 4,4'-bis(phenylethynyl)-1,1'-biphenyl; 4,4'-diethynyl-diphenylether, and mixtures thereof. More preferably, the monomers of formula (5) are chosen from: 1,3-diethynylbenzene; 1,4-diethynylbenzene; 1,3,5-triethynylbenzene; 1,3,5-tris-(phenylethynyl)benzene; 4,4'-diethynyl-1,1'-biphenyl; 1,3-bis(phenylethynyl)-benzene; 1,4-bis(phenylethynyl)benzene; 4,4'-bis(phenylethynyl)-1,1'-biphenyl; and mixtures thereof. Even more preferably, the second monomers are chosen from: 1,3-diethynylbenzene; 1,4-diethynylbenzene; 4,4'-diethynyl-1,1'-biphenyl; 1,3,5-triethynylbenzene; 1,3,5-tris(phenylethynyl)benzene; and mixtures thereof.

Polyarylene oligomers of the present invention may be comprised of one or more first monomers of formula (1), or a mixture of two or more different first monomers of formula (1). The present polyarylene oligomers may be comprised of one second monomer of formula (5), or a mixture of two or more different second monomers of formula (5). Monomers of formula (6) are preferred second monomers. It is preferred that the present oligomers are comprised of polymerized units of one or more first monomers of formula (1) and one or more second monomers of formula (6). In an alternate preferred embodiment, the present oligomers are comprised of polymerized units of one or more first monomers of formula (1) and one or more second monomers of formula (7), or in yet another alternate embodiment of one or more first monomers of formula (1), one or more second monomers of formula (6) and one or more second monomers of formula (7). Mixtures of oligomers comprising as polymerized units one or more first monomers of formula (1) and one or more second monomers of formula (5) may suitably be used.

The present polyarylene oligomers may optionally further comprise as polymerized units one or more end-capping monomers. Preferably, only one end-capping monomer is used. As used herein, the term "end-capping monomer" refers to monomers having a single dienophilic moiety, where such dienophilic moiety functions to cap one or more ends of the present oligomers such that capped ends of the oligomers are incapable of further Diels-Alder polymerization. Preferably, the dienophilic moiety is an alkynyl moiety. Optionally, the end-capping monomer may comprise one or more solubility enhancing polar moieties, such as those disclosed in U.S. Published Pat. App. No. 2016/0060393. It is preferred that the end-capping monomers are free of solubility enhancing polar moieties. Preferred end-capping monomers are those of formula (13)

 (13)

wherein $R^{20}$ and $R^{21}$ are each independently chosen from H, $C_{5-20}$-aryl, and $C_{1-20}$-alkyl. Preferably, $R^{20}$ and $R^{21}$ are each independently chosen from H, $C_{6-20}$-aryl, and $C_{1-20}$-alkyl. More preferably, $R^{20}$ is $C_{5-20}$-aryl, and even more preferably $C_{6-20}$-aryl. $R^{21}$ is preferably H or $C_{1-20}$-alkyl. When employed, such end-capping monomers are typically used in a molar ratio of 1:0.01 to 1:1.2 of first monomer to end-capping monomer.

Exemplary end capping monomers include, but are not limited to: styrene; α-methylstyrene; β-methylstyrene; norbornadiene; ethynylpyridine; ethynylbenzene; ethynylnaphthylene; ethynylpyrene; ethynylanthracene; ethynylphenanthrene; diphenylacetylene; 4-ethynyl-1,1'-biphenyl; 1-propynylbenzene; propiolic acid; 1,4-butynediol; acetylenedicarboxylic acid; ethynylphenol; 1,3-diethynylbenzene; propargyl aryl esters; ethynyl phthalic anhydride; diethynyl benzoic acid; and 2,4,6-tris(phenylethynyl)anisole. Preferred end capping monomers are: ethynylbenzene, norbornadiene; ethynylnaphthylene, ethynylpyrene, ethynylanthracene, ethynylphenanthrene, and 4-ethynyl-1,1'-biphenyl.

The oligomers of the present invention are prepared by reacting one or more first monomers with one or more second monomers and any optional end capping monomers in a suitable organic solvent. The mole ratio of the total first monomers to the total second monomers is from 1:>1, preferably from 1:1.01 to 1:1.5, more preferably from 1:1.05 to 1:1.4, and yet more preferably from 1:1.2 to 1:1.3. The total moles of second monomers used are greater than the total moles of first monomers used. Suitable organic solvents useful to prepare the present oligomers are benzyl esters of $(C_2$-$C_6)$alkanecarboxylic acids, dibenzyl esters of $(C_2$-$C_6)$ alkanedicarboxylic acids, tetrahydrofurfuryl esters of $(C_2$-$C_6)$alkanecarboxylic acids, ditetrahydrofurfuryl esters of $(C_2$-$C_6)$alkanedicarboxylic acids, phenethyl esters of $(C_2$-$C_6)$alkanecarboxylic acids, diphenethyl esters of $(C_2$-$C_6)$ alkanedicarboxylic acids, aromatic ethers, N-methyl pyrrolidone (NMP), and gamma-butyrolactone (GBL). Preferred aromatic ethers are diphenyl ether, dibenzyl ether, $(C_1$-$C_6)$ alkoxy-substituted benzenes, benzyl $(C_1$-$C_6)$alkyl ethers, NMP and GBL, and more preferably $(C_1$-$C_4)$alkoxy-substituted benzenes, benzyl $(C_1$-$C_4)$alkyl ethers, NMP, and GBL. Preferred organic solvents are benzyl esters of $(C_2$-$C_4)$ alkanecarboxylic acids, dibenzyl esters of $(C_2$-$C_4)$alkanedicarboxylic acids, tetrahydrofurfuryl esters of $(C_2$-$C_4)$alkanecarboxylic acids, ditetrahydrofurfuryl esters of $(C_2$-$C_4)$ alkanedicarboxylic acids, phenethyl esters of $(C_2$-$C_4)$ alkanecarboxylic acids, diphenethyl esters of $(C_2$-$C_4)$ alkanedicarboxylic acids, $(C_1$-$C_6)$alkoxy-substituted benzenes, benzyl $(C_1$-$C_6)$alkyl ethers, NMP, and GBL, more preferably benzyl esters of $(C_2$-$C_6)$alkanecarboxylic acids, tetrahydrofurfuryl esters of $(C_2$-$C_6)$alkanecarboxylic acids, phenethyl esters of $(C_2$-$C_6)$alkanecarboxylic acids, $(C_1$-$C_4)$ alkoxy-substituted benzenes, benzyl $(C_1$-$C_4)$alkyl ethers, dibenzyl ether, NMP, and GBL, and yet more preferably benzyl esters of $(C_2$-$C_6)$alkanecarboxylic acids, tetrahydrofurfuryl esters of $(C_2$-$C_6)$alkanecarboxylic acids, $(C_1$-$C_4)$ alkoxy-substituted benzenes, benzyl $(C_1$-$C_4)$alkyl ethers, NMP, and GBL Exemplary organic solvents include, without limitation, benzyl acetate, benzyl proprionate, tetrahydrofurfuryl acetate, tetrahydrofurfuryl propionate, tetrahydrofurfuryl butyrate, anisole, methylanisole, dimethylanisole, dimethoxybenzene, ethylanisole, ethoxybenzene, benzyl methyl ether, and benzyl ethyl ether, and preferably benzyl acetate, benzyl proprionate, tetrahydrofurfuryl acetate, tetrahydrofurfuryl propionate, tetrahydrofurfuryl butyrate, anisole, methylanisole, dimethylanisole, dimethoxybenzene, ethylanisole, and ethoxybenzene.

The oligomers of the present invention may be prepared by combining the first monomer, the second monomer, any optional end capping monomer, and organic solvent, each as described above, in any order in a vessel and heating the mixture. Preferably, the present oligomers are prepared by combining the first monomer, the second monomer, and organic solvent, each as described above, in any order in a vessel and heating the mixture. Alternatively, the first monomer may first be combined with the organic solvent in a vessel, and the second monomer then added to the mixture. In one alternate embodiment, the first monomer and organic solvent mixture is first heated to the desired reaction temperature before the second monomer is added. The second monomer may be added at one time, or alternatively, may be added over a period of time, such as from 0.25 to 6 hours, to reduce exotherm formation. The first monomer and organic solvent mixture may first be heated to the desired reaction temperature before the second monomer is added. The present end-capped oligomers may be prepared by first preparing an oligomer by combining the first monomer, the second monomer, and organic solvent in any order in a vessel and heating the mixture, followed by isolating the oligomer, and then combining the isolated oligomer with an end-capping monomer in an organic solvent and heating the mixture for a period of time. Alternatively, the present end-capped oligomers may be prepared by combining the first monomer, the second monomer, and organic solvent in any order in a vessel and heating the mixture for a period of time to provide the desired oligomer, and then adding the end-capping monomer to the oligomer reaction mixture and heating the reaction mixture for a period of time. The reaction mixture is heated at a temperature of 100 to 250° C. Preferably, the mixture is heated to a temperature of 150 to 225° C., and more preferably to a temperature of 175 to 215° C. Typically, the reaction is allowed to proceed for 2 to 20 hours, preferably 2 to 8 hours, and more preferably 2 to 6 hours, with shorter reaction times yielding relatively lower molecular weight oligomers. The reaction may be carried out under oxygen-containing atmosphere, but an inert atmosphere such as nitrogen is preferred. Following the reaction, the resulting oligomer may be isolated from the reaction mixture or used as is for coating a substrate.

While not intending to be bound by theory, it is believed that the present polyarylene oligomers are formed through the Diels-Alder reaction of the cyclopentadienone moieties of the first monomer with the alkynyl moieties of the second monomer upon heating. During such Diels-Alder reaction, a carbonyl-bridged species forms. It will be appreciated by those skilled in the art that such carbonyl-bridged species may be present in the oligomers. Upon further heating, the carbonyl bridging species will be essentially fully converted to an aromatic ring system. Due to the mole ratio of the monomers used, the present oligomers contain arylene rings in the oligomer backbone as illustrated in the following reaction scheme, where A is the first monomer, B is the second monomer, and Ph is phenyl.

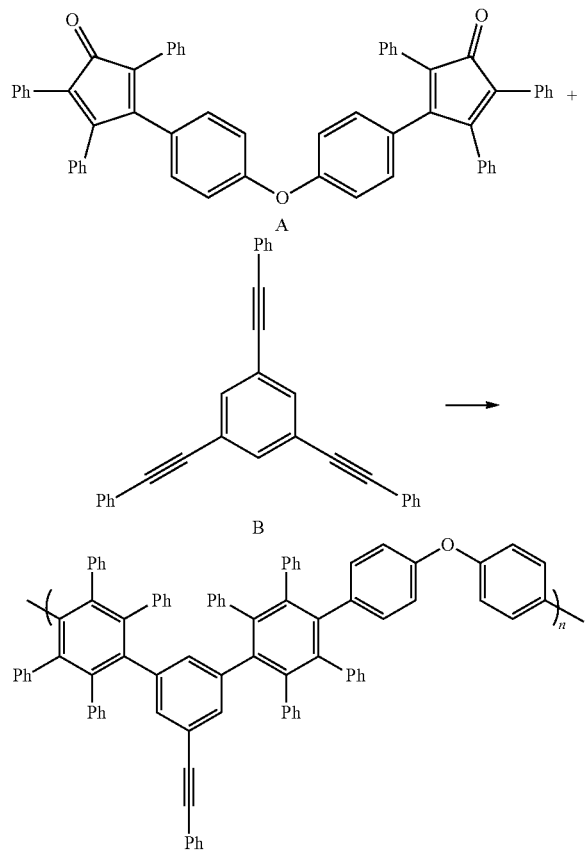

The polyarylene oligomers of the invention have a weight average molecular weight ($M_w$) of 1000 to 6000 Da, preferably from 1000 to 5000 Da, more preferably from 1000 to 4000 Da, yet more preferably from 1500 to 4000 Da, even more preferably from 1500 to 3500 Da, and still more preferably from 1700 to 3500 Da. Polyarylene oligomers of the invention typically have a number average molecular weight ($M_n$) in the range of 1500 to 3000 Da. The present polyarylene oligomers have a polydispersity index (PDI) of 1 to 2, preferably from 1 to 1.99, more preferably from 1 to 1.9, yet more preferably from 1 to 1.8, and still more preferably from 1.25 to 1.75. $PDI=M_w/M_n$. The $M_n$ and $M_w$ of the present polymers are determined by the conventional technique of gel permeation chromatography (GPC) against polystyrene standards using uninhibited tetrahydrofuran (THF) as eluting solvent at 1 mL/min and a differential refractometer detector. The present oligomers have a degree of polymerization (DP) in the range of from 2 to 5, preferably from 2 to 4.5, more preferably from 2 to 3.75, and yet more preferably from 2 to 3.5. DP is calculated by dividing the molecular weight of the oligomer by the molecular weight of the respective repeating unit, exclusive of any end capping monomer present. The present oligomers have a total first monomer to total second monomer mole ratio of 1 to ≥1, preferably a ratio of 1:1.01 to 1:1.5, more preferably a ratio of 1:1.05 to 1:1.4, yet more preferably a ratio of 1:1.1 to 1:1.3, still more preferably from 1:1.15 to 1:1.3, and even more preferably from 1:1.2 to 1:1.3. The ratio of the total moles of first monomer to total moles of second monomer are typically calculated as the feed ratio of the monomers, but may also be determined using conventional matrix-assisted laser desorption/ionization (MALDI) time-of-flight (TOF) mass spectrometry, with silver trifluoroacetate being added to the samples to facilitate ionization. A suitable instrument is a Bruker Daltonics Ultraflex MALDI-TOF mas spectrometer equipped with a nitrogen laser (337 nm wavelength). Particularly preferred oligomers of the present invention at those having a $M_w$ of 1700 to 3500, a PDI of 1.25 to 1.75, and a ratio of total moles of first monomer to total moles of second monomer of from 1:1.2 to 1:1.3.

Unlike conventional polyarylene polymers or oligomers prepared from the Diels-Alder reaction of biscyclopentadienone monomers and polyalkyne-substituted aromatic monomers, the present polyarylene oligomers have good solubility in organic solvents conventionally used in semiconductor manufacturing, such as propylene glycol methyl ether (PGME), propylene glycol methyl ether acetate (PGMEA), methyl 3-methoxypropionate (MMP), ethyl lactate, anisole, NMP, GBL, ethoxybenzene, benzyl propionate, and mixtures thereof. The improved solubility of the present oligomers is achieved without the use of polar moieties as substituents on the oligomer backbone or on end capping monomers.

The present oligomers in the organic reaction solvent can be directly cast as a film, applied as a coating or poured into a non-solvent to precipitate the oligomer. Water, methanol, ethanol isopropanol and other similar polar liquids, such as glycol ethers, or mixtures thereof are typical non-solvents which can be used to precipitate the oligomer. Solid oligomer may be dissolved and processed from a suitable organic solvent described above, or from organic solvents typically used in the electronics industry, such as PGME, PGMEA, MMP, ethyl lactate, n-butyl acetate, anisole, NMP, GBL, ethoxybenzene, benzyl propionate, benzyl benzoate, propylene carbonate, xylene, mesitylene, cumene, limonene, and mixtures thereof. Mixtures of organic solvents are particularly preferred, such as a mixture comprising one or more of anisole, ethoxybenzene, PGME, PGMEA, GBL, MMP, n-butyl acetate, benzyl propionate and benzyl benzoate in combination with one or more additional organic solvents, and more preferably a mixture comprising two or more of anisole, ethoxybenzene, PGME, PGMEA, GBL, MMP, n-butyl acetate, benzyl propionate, xylene, mesitylene, cumene, limonene, and benzyl benzoate. When a mixture of solvents is used, the ratio of solvents is generally not critical and may vary from 99:1 to 1:99 w/w, provided that the solvent mixture is able to dissolve the present oligomer. It will be appreciated by those skilled in the art that the concentration of the oligomer in the organic reaction solvent may be adjusted by removing a portion of the organic solvent or by adding more of the organic solvent, as may be desired.

Oligomers of the invention are useful in forming relatively high carbon-content underlayers in photolithographic processes in the manufacture of semiconductor devices. A suitable method using the present oligomers comprises: (a) providing a semiconductor device substrate having a relief image on a surface of the substrate, the relief image having a plurality of gaps to be filled; (b) applying a coating composition to the relief image and filling the gaps to provide a coating layer, wherein the coating composition comprises (i) a polyarylene oligomer comprising as polymerized units one or more first monomers having two or more cyclopentadienone moieties and one or more second monomers having an aromatic moiety and two or more alkynyl moieties; wherein the polyarylene oligomer has a $M_w$ of 1000 to 6000 Da, a PDI of 1 to 2, and a molar ratio of total first monomers to total second monomers of 1:>1; and (ii) one or more organic solvents; (c) curing the coating layer to form a polyarylene film; (d) disposing a layer of an inorganic hardmask on the polyarylene film; (e) disposing a layer of a photoresist on the inorganic hardmask layer, (f) patterning the photoresist layer; (g) transferring the pattern from the photoresist layer to the polyarylene film; and (h) then transferring the pattern to the semiconductor device substrate.

Any suitable semiconductor device substrate may be used in the present method. Such semiconductor device substrates are typically composed of one or more of silicon, polysilicon, silicon oxide, silicon nitride, silicon oxynitride, silicon germanium, gallium arsenide, aluminum, sapphire, tungsten, titanium, titanium-tungsten, nickel, copper, and gold. Suitable semiconductor device substrates may be in the form of wafers such as those used in the manufacture of integrated circuits, and the like. As used herein, the term "wafer" is intended to encompass "an electronic device substrate," "a semiconductor substrate," "a semiconductor device," and various packages for various levels of interconnection, including a single-chip wafer, multiple-chip wafer, packages for various levels, or other assemblies requiring solder connections. Such substrates may be any suitable size. Preferred wafer substrate diameters are 200 mm to 300 mm, although wafers having smaller and larger diameters may be suitably employed according to the present invention. As used herein, the term "semiconductor substrate" includes any substrate having one or more semiconductor layers or structures which may optionally include active or operable portions of semiconductor devices. A semiconductor device refers to a semiconductor substrate upon which at least one microelectronic device has been or is being batch fabricated. Patterned semiconductor device substrates are semiconductor device substrates having a relief image on a surface of the substrate, the relief image having a plurality of gaps to be filled. Such semiconductor device substrates may be patterned by methods well-known in the art, and may consist of lines and spaces of various dimensions.

In use, the coating composition comprising the present oligomer and organic solvent may be coated by any suitable method on a patterned semiconductor device substrate. Suitable methods for coating the composition include, but are not limited to, spin-coating, curtain coating, spray coating, roller coating, doctor blading, bar coating, dip coating, slot die coating, and vapor deposition, among other methods, but are preferably disposed on the substrate by spin-coating. In the electronics manufacturing industry, spin-coating and slot-die coating are preferred methods to take advantage of existing equipment and processes. In spin-coating, the solids content of the composition may be adjusted, along with the spin speed, to achieve a desired thickness of the composition on the surface it is applied to. Typically, the present compositions are spin-coated at a spin speed of 400 to 4000 rpm. The amount of the composition dispensed on the wafer or substrate depends on the total solids content in the composition, the size of the substrate to be coated, the desired thickness of the resulting coating layer, and other factors well-known to those skilled in the art.

When the present oligomer compositions are used to deposit a coating or film using certain techniques, such as spin-coating, the resulting coating may suffer from certain defects. While not wishing to be bound by theory, it is believed that such defects result from the condensation of moisture on the film surface due to evaporative cooling, and such moisture forces the oligomer out of solution, resulting in a non-uniform coating of oligomer on the surface. To address such defects, a secondary solvent, which is both water-miscible and miscible with the organic solvent used in the composition, may optionally be added to the present oligomer composition. It is believed that such secondary solvent prevents the formation of water droplets during deposition of the oligomer coating on the substrate. Such secondary solvent may be added to the present composition in any suitable amount, such as from 0 to 40 wt %, based upon the total weight of the composition, and preferably from 0 to 30 wt %. Ethyl lactate and gamma-butyrolactone are examples of such a secondary solvent. Optionally, one or more secondary additives may be added to the present compositions, such as a surfactant, which may be nonionic, cationic, anionic or amphoteric. Each such secondary additive may be added to the compositions in an amount of from 0 to 5 wt %, and preferably from 0 to 2 wt %.

In general, the present coating compositions comprise a polyarylene oligomer of the invention, an organic solvent, and an optional secondary solvent, each as described above, wherein the oligomer is present in an amount of 1 to 45% solids, and preferably from 5 to 35% solids. Such compositions can be used to deposit an oligomer coating on a patterned semiconductor device substrate, where the oligomer coating layer has a suitable thickness, such as from 10 nm to 500 µm, preferably from 100 nm to 250 µm, and more preferably from 100 nm to 125 µm, although such coatings may be thicker or thinner than these ranges depending on the particular application. The present compositions substantially fill, preferably fill, and more preferably fully fill, a plurality of gaps on a patterned semiconductor device substrate. An advantage of the present oligomers is that they planarize (form planar layers over a patterned substrate) and fill the gaps with substantially no voids being formed, and preferably without forming voids.

Preferably, after being coated on the patterned semiconductor device substrate surface, the oligomer composition is heated (soft baked) to remove any organic solvent present. Typical baking temperatures are from 80 to 170° C., although other suitable temperatures may be used. Such baking to remove residual solvent is typically done for approximately 30 sec. to 10 min., although longer or shorter times may suitably be used. Following solvent removal, a layer, film or coating of the oligomer on the substrate surface is obtained. Preferably, the oligomer is next cured to form a polyarylene film. Such curing is typically achieved by heating, such as heating to a temperature of ≥300° C., preferably ≥350° C., and more preferably ≥400° C. Such curing step may take from 2 to 180 min., preferably from 10 to 120 min., and more preferably from 15 to 60 min., although other suitable times may be used. Upon curing, it is believed that the present oligomers further polymerize. Such curing step may be performed in an oxygen-containing atmosphere or in an inert atmosphere, and preferably in an inert atmosphere.

In certain applications, it is known that certain cured polyarylene films may not have sufficient adhesion to substrate surfaces and require the use of an adhesion promoter, such as described in U.S. Pat. No. 5,668,210. Such adhesion promoter is typically applied to the substrate surface before the deposition of the polyarylene oligomer layer, which is subsequently cured to form the crosslinked polyarylene film. If it is desired to use an adhesion promoter, any suitable adhesion promoter known in the art for polyarylene films may be used, such as silanes, and preferably organosilanes such as trimethoxyvinylsilane, triethoxyvinylsilane, hexamethyldisilazane [$(CH_3)_3Si—NH—Si(CH_3)_3$], or an aminosilane coupler such as gamma-aminopropyltriethoxysilane. Particularly suitable adhesion promoters include those sold under the AP 3000, AP 8000, and AP 9000S designations, available from Dow Electronic Materials (Marlborough, Mass.). Such adhesion promoters are typically not used in gap-filling applications as the gap-filling layer is removed during subsequent processing of the semiconductor device.

An inorganic hardmask layer is disposed on the polyarylene film. Any suitable inorganic hardmask layer used in the manufacture of semiconductor devices may be used. Such inorganic hardmask layer typically contains one or more elements chosen from silicon, titanium, tantalum, aluminum, and the like. Exemplary hardmask layers include, without limitation, silica, siloxanes, SiON, alumina, titanium nitride, silicon nitride, and tantalum nitride. Preferably, the hardmask layer comprises silicon. More preferably, such hardmask layer is a silicon-containing layer that further comprises an antireflectant moiety. Such hardmask layer may be vapor deposited or deposited by spin-coating techniques, both of which are well-known in the art. Hardmask layers are used in a variety of thicknesses, depending on the particular manufacturing process used. The choice of such hardmask layer and the thickness employed is within the ability of those skilled in the art. Materials suitable for use as spin-coated hardmask layers are generally commercially available.

Optionally, an organic antireflectant layer may be disposed directly on the inorganic hardmask layer. Any suitable organic antireflectant may be used. As used herein, the term "antireflectant" refers to a moiety or a material that absorbs actinic radiation at the wavelength of use. Suitable organic antireflectants are those sold under the ART brand by Dow Electronic Materials. The particular antireflectant used will depend on the particular photoresist used, the manufacturing process used, and on other considerations well within the ability of those skilled in the art. In use, the organic antireflectant is typically spin-coated onto the hardmask surface, followed by heating (soft baking) to remove any residual solvent and then curing to form an organic antireflectant layer. Such soft baking and curing steps may be performed in a single step.

A photoresist layer is then deposited on the hardmask layer, such as by spin-coating. In one preferred embodiment, the photoresist layer is deposited directly on the hardmask layer (called a tri-layer process). In an alternate preferred embodiment, the photoresist layer is deposited directly on the organic antireflectant layer (called a quad-layer process). A wide variety of photoresists may be suitably used, such as those used in 193 nm lithography, such as those sold under the EPIC™ brand available from Dow Electronic Materials (Marlborough, Mass.). Suitable photoresists may be either positive tone development or negative tone development resists.

Optionally, one or more barrier layers may be disposed on the photoresist layer. Suitable barrier layers include a topcoat layer, a top antireflectant coating layer (or TARC layer), and the like. Preferably, a topcoat layer is used when the photoresist is patterned using immersion lithography. Such topcoats are well-known in the art and are generally commercially available, such as OC™ 2000 available from Dow Electronic Materials. It will be appreciated by those skilled in the art that a TARC layer is not needed when an organic antireflectant layer is used under the photoresist layer.

Following coating, the photoresist layer is then imaged (exposed) using patterned actinic radiation, and the exposed photoresist layer is then developed using the appropriate developer to provide a patterned photoresist layer. The photoresist is preferably patterned using an immersion lithography process, which is well-known to those skilled in the art. The pattern is next transferred from the photoresist layer to the underlayers by an appropriate etching techniques known in the art, such as by plasma etching, resulting in a patterned hardmask layer in a tri-layer process and a patterned organic antireflectant layer in a quad-layer process. If a quad-layer process is used, the pattern is next transferred from the organic antireflectant layer to the hardmask layer using appropriate pattern transfer techniques, such as plasma etching. After the hardmask layer is patterned, the polyarylene film underlayer is then patterned using appropriate etching techniques, such as $O_2$ or $CF_4$ plasma. Any remaining patterned photoresist and organic antireflectant layers are removed during etching of the polyarylene film underlayer. Next, the pattern is transferred to the semiconductor device substrate, such as by appropriate etching techniques, which also removes any remaining hardmask layer, followed by removal of any remaining patterned polyarylene film underlayer to provide a patterned semiconductor device substrate. The patterned semiconductor device substrate is then processed according to conventional means. As used herein, the term "underlayers" refers to all removable processing layers between the semiconductor device substrate and the photoresist layer, namely the optional organic antireflectant layer, hardmask layer, and the polyarylene film.

Oligomers of the invention may also be used in a self-aligned double patterning process. In such a process, a layer of an oligomer coating composition described above is coated on a substrate, such as by spin-coating. Any remaining organic solvent is removed and the oligomer coating layer is cured to form a polyarylene resin underlayer. A suitable middle layer, such as a silicon-containing hardmask layer is coated on the polyarylene film underlayer. A layer of a suitable photoresist is then coated on the middle layer, such as by spin coating. The photoresist layer is then imaged (exposed) using patterned actinic radiation, and the exposed photoresist layer is then developed using the appropriate developer to provide a patterned photoresist layer. The pattern is next transferred from the photoresist layer to the middle layer and the polyarylene resin underlayer by appropriate etching techniques to expose portions of the substrate. Typically, the photoresist is also removed during such etching step. Next, a conformal silicon-containing layer is disposed over the patterned polyarylene resin underlayer and exposed portions of the substrate. Such silicon-containing layer is typically an inorganic silicon layer such as SiON or $SiO_2$ which is conventionally deposited by CVD. Such conformal coatings result in a silicon-containing layer on the exposed portions of the substrate surface as well as over the underlayer pattern, that is, such silicon-containing layer substantially covers the sides and top of the underlayer pattern. Next, the silicon-containing layer is partially etched (trimmed) to expose a top surface of the patterned polyarylene resin underlayer and a portion of the substrate. Following this partial etching step, the pattern on the substrate comprises a plurality of features, each feature comprising a line or post of the polyarylene resin underlayer with the silicon-containing layer directly adjacent to the sides of each polyarylene resin underlayer feature. Next, the polyarylene resin underlayer is removed, such as by etching, to expose the substrate surface that was under the polyarylene resin underlayer pattern, and providing a patterned silicon-containing layer on the substrate surface, where such patterned silicon-containing layer is doubled (that is, twice as many lines and/or posts) as compared to the patterned polyarylene resin underlayer.

Films formed from the present polyarylene oligomers show improved thermal stability, as measured by weight loss, as compared to conventional polyarylene polymers or oligomers prepared from the Diels-Alder reaction of biscyclopentadienone monomers and polyalkyne-substituted aromatic monomers. Cured films formed from the present oligomers have ≤4% weight loss after heating at 450° C. for 1 hour, and preferably <4% weight loss. Such cured films also have a decomposition temperature of >480° C. as determined by 5% weight loss, and preferably >490° C. Higher decomposition temperatures are desired to accommodate higher processing temperatures use din the manufacture of semiconductor devices.

EXAMPLE 1

A mixture of 30.0 g of 3,3'-(oxydi-1,4-phenylene)bis(2,4,5-triphenylcyclopentadienone) (DPO-CPD), 18.1 g 1,3,5-tris(phenylethynyl)benzene (TRIS) and 102.2 g of GBL was heated at 185° C. for 14 hrs. The reaction was then allowed to cool to room temp and diluted with 21.5 g of GBL. The crude reaction mixture was added to 1.7 L of a 1:1 mixture of isopropyl alcohol (IPA)/PGME and stirred for 30 min. The solid was collected by vacuum filtration and washed with 1:1 mixture of IPA/PGME. To the solid was added 0.4 L of water and the slurry was heated to 50° C. and stirred at 50° C. for 30 min. The warm slurry was filtered by vacuum filtration. The wet cake was vacuum dried for 2 days at 70° C. providing 34.1 g of Oligomer 1 in 71% yield. Analysis of Oligomer 1 provided a $M_w$ of 3487 Da and a PDI of 1.42.

EXAMPLE 2

A mixture of 30.0 g of DPO-CPD, 18.1 g TRIS and 102.2 g of GBL was heated at 200° C. for 6 hrs. The reaction was then allowed to cool to room temp and diluted with 21.5 g of GBL. The crude reaction mixture was added to 1.7 L of a 1:1 mixture of IPA/PGME and stirred for 30 min. The solid was collected by vacuum filtration and washed with 1:1 mixture of IPA/PGME. To the solid was added 0.4 L of water and the slurry was heated to 50° C. and stirred at 50° C. for 30 min. The warm slurry was filtered by vacuum filtration. The wet cake was vacuum dried for 2 days at 70° C. providing 34.1 g of Oligomer 2 in 71% yield. Analysis of Oligomer 2 provided a $M_w$ of 3490 Da and a PDI of 1.42.

EXAMPLE 3

The procedure of Example 2 was repeated to provide Oligomers 3 to 11. The molar ratio of total first monomer to total second monomer (F/S Mole Ratio) for each oligomer charged into the reaction vessel is reported in Table 1.

Oligomers 3 to 11 were analyzed by gel permeation chromatography (GPC) on an Agilent GPC instrument with a differential refractometer operated at 35° C. The SEC column set used in this study was composed of Shodex-KF805, Shodex-KF804, Shodex-KF803 and Shodex-KF802 in series. The chromatography was performed in uninhibited THF at flow rate of 1 mL/min using polystyrene narrow standards of 162 to 483,000 Da were used for calibration. The determined $M_w$ for each of Oligomers 3 to 11 is reported below in Table 1, and was used to calculate the polydispersity index (PDI) and the degree of polymerization (DP), each of which is reported in Table 1.

TABLE 1

| Oligomer No. | $M_w$ (Da) | PDI | DP | F/S Mole Ratio |
| --- | --- | --- | --- | --- |
| 3 | 2254 | 1.47 | 2.04 | 1:1.25 |
| 4 | 2506 | 1.51 | 2.27 | 1:1.25 |
| 5 | 3046 | 1.59 | 2.76 | 1:1.25 |
| 6 | 3224 | 1.63 | 2.92 | 1:1.25 |
| 7 | 3544 | 1.6 | 3.21 | 1:1.25 |
| 8 | 3904 | 1.68 | 3.54 | 1:1.25 |
| 9 | 2204 | 1.45 | 2.00 | 1:1.11 |
| 10 | 3174 | 1.66 | 2.88 | 1:1.1 |
| 11 | 3994 | 1.75 | 3.62 | 1:1.1 |

EXAMPLE 4

Oligomer 5 (10 g) from Example 3 was charged to a 100 mL single neck round bottom flask equipped with a reflux condenser, thermocouple and nitrogen atmosphere; followed by GBL (20 g). The reaction was stirred and warmed to 145° C., at which point phenyl acetylene (1 g) was added as an end-capping monomer. The reaction was kept at 145° C. for a total of 12 hours, at which point the reaction became transparent. The end-capped oligomer was isolated by precipitating the reaction mixture into an excess (200 g) of methyl tert-butyl ether (MTBE) to yield 7 g of End-Capped Oligomer EC1, as illustrated in the following reaction scheme.

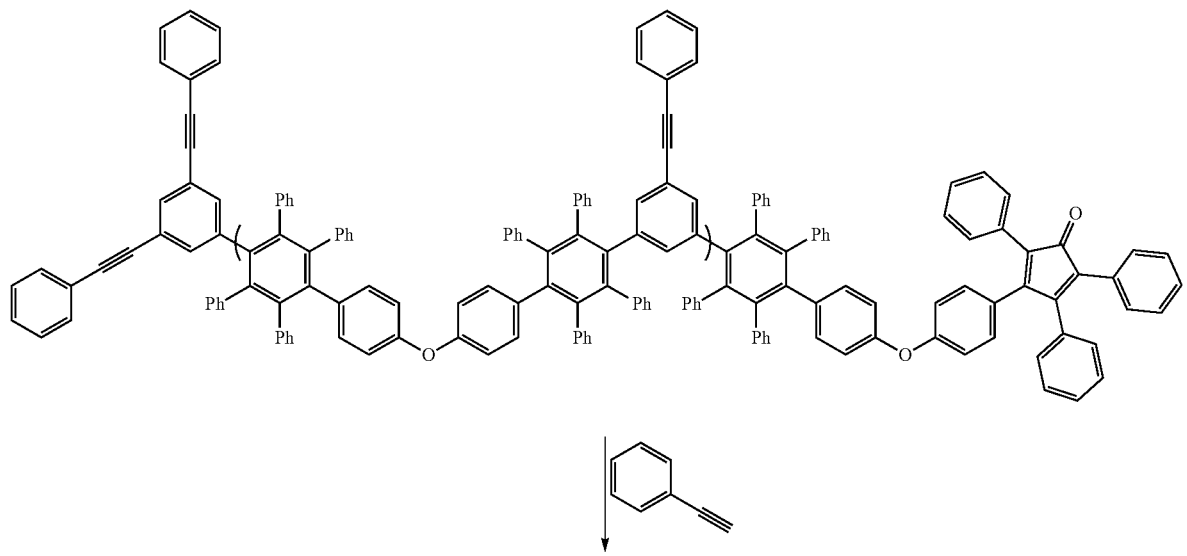

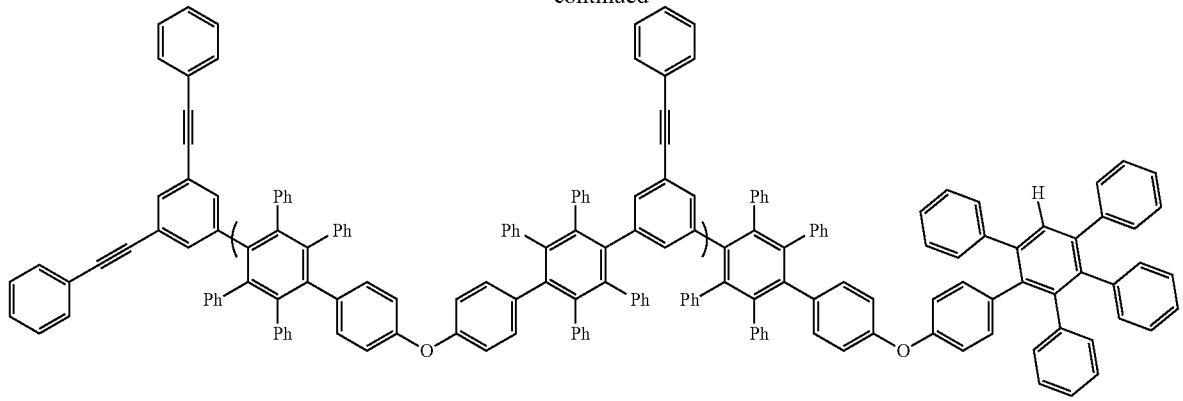

EXAMPLE 5

DPO-CPD (100 g 0.128 mol, 1 eq) and TRIS (60.43 g, 0.160 mol, 1.25 eq) were charged to a 1 L, three-neck round bottom flask, followed by GBL (374 g, 30% solids). The solution was stirred and heated to 185° C. within 30 minutes and heated for an additional 16 hours. The reaction was then cooled to 145° C., and phenylacetylene (17.8 g, 1.136 eq) was added. The reaction was heated at 145° C. for a total of 12 hours, and then cooled to 20° C. Isolation of the resulting end-capped oligomer was accomplished by precipitation of the reaction into a mixture of MTBE and heptanes (700 mL+300 mL) to provide 112 g of End-Capped Oligomer EC2.

EXAMPLE 6

The procedure of Example 4 was repeated except that the phenyl acetylene was replaced with each of the following end-capping monomers to provide the End-Capped Oligomers reported in Table 2.

TABLE 2

| End-Capping Monomer | End-Capped Oligomer No. |
| --- | --- |
| Propiolic Acid | EC3 |
| 1,4-Butynediol | EC4 |
| Acetylendicarboxylic acid | EC5 |
| Ethynyl Phenol | EC6 |
| 1,3-Diethynyl benzene | EC7 |
| Ethynyl Phthalic anhydride | EC8 |
| Diphenylacetylene | EC9 |
| Diethynyl benzoic acid | EC10 |
| Norbomadiene | EC11 |
| 2,4,6-tris(phenylethynyl)anisole | EC12 |

COMPARATIVE EXAMPLE 1

A mixture of DPO-CPD and TRIS in a mole ratio of 1:1.08 at a concentration of 30-40 wt % of solids in GBL heated to the target temperature of 200° C. until an $M_w$ of approximately 8800 Da was obtained (approximately 10-15 hours). The reactor was then cooled to 120° C. to stop further reaction. Cyclohexanone was added to dilute the polyarylene polymer to form a storage solution. 1 L of the storage solution was added to 10 L of isopropanol over 30 minutes. After the addition was complete, the solution was stirred for 1 hour, after which time the resulting precipitate was filtered, washed with 1 L of IPA twice, followed by air drying and then vacuum drying at 50° C. overnight to provide 327.3 g of Comparative Oligomer 1. Comparative Oligomer 1 was analyzed by MALDI-time of flight mass spectrometry and GPC according to Example 4 and was found to have a Mw of ca. 7700, a PDI of 2.04, and a DP of 6.97. Comparative Oligomer 1 corresponds to the polyphenylene used in SiLK™ D, a commercially available product from The Dow Chemical Company.

COMPARATIVE EXAMPLE 2

The procedure of Example 2 was repeated except that the ratio of DPO-CPD to TRIS was 1:0.88. The resulting Comparative Oligomer 2. Comparative Oligomer 2 was analyzed by MALDI-time of flight mass spectrometry and GPC according to Example 4 and was found to have a Mw of 3300, a PDI of 1.4, and a DP of 2.99.

EXAMPLE 7

Formulations were prepared by dissolving each of Oligomers 3 to 1 and Comparative Oligomers 1 and 2 in a mixture of PGMEA and benzyl benzoate at approximately 4 wt % solids to provide Formulations 3 to 11 and Comparative Formulations 1 and 2, respectively. Similarly, Formulation 12 was prepared using End-Capped Oligomer EC1. Each obtained formulation was filtered through a 0.2 μm poly(tetrafluoroethylene) (PTFE) syringe filter before use.

EXAMPLE 8

The formulation samples from Example 7 were mixed with solvents commonly used in semiconductor industry indicated in Table 3, and their compatibility was evaluated by mixing the samples and the solvent at 1:10 weight ratio. Turbidity of the resulting mixture was measured by a Turbidity meter from Orbeco-Hellige Co. Turbidity sensors measure suspended material in a liquid, typically by measuring the amount of light transmitted through the liquid. A higher turbidity value indicates a higher amount of material suspended in the liquid. Samples having a turbidity value of less than 1 in PGMEA/PGME (30/70 w/w) were considered to pass. Samples having a turbidity value of less than 25 in PGME were considered to pass. Table 3 shows the result of these turbidity determinations. Formulation samples of the invention showed good compatibility with various conventional clean room track solvents whereas the comparative formulation sample showed limited compatibility.

TABLE 3

| Formulation | PGMEA/PGME 30/70 w/w | PGME | Ethyl Lactate |
|---|---|---|---|
| 3 | 0.09 | 0.07 | — |
| 4 | 0.08 | 0.04 | — |
| 5 | 0.08 | 0.05 | 0.19 |
| 6 | 0.06 | 0.15 | — |
| 7 | 0.07 | 0.39 | — |
| 8 | 0.09 | 11 | — |
| 9 | 0.08 | 0.04 | — |
| 10 | 0.06 | 0.07 | — |
| 11 | 0.06 | 5.34 | — |
| 12 | 0.11 | — | — |
| Comparative 1 | 3.5 | 234 | >100 |
| Comparative 2 | 0.08 | 7.02 | — |

EXAMPLE 9

Thermal stability of cured films of certain oligomers of Example 3 were evaluated via thermogravimetric analysis (TGA) on a Q500 Thermal Gravimetric Analyzer from TA-Instruments. Films were cured at 170° C. for 60 seconds and 350° C. for 60 seconds in air. Cured films were prepared on bare silicon wafers and scraped off the wafer for thermogravimetric analysis. A sample of each cured film was analyzed to determine the temperature at which 5 wt % of the film was lost due to decomposition ($T_{d(5\%)}$) using the following conditions: under nitrogen atmosphere, ramp at 10° C./min to 150° C., isothermal hold at 150° C. for 10 min., followed by ramp at 10° C./min to 700° C. The $T_{d(5\%)}$ for each film sample is reported in Table 4. Another sample of each cured film was also analyzed by thermogravimetric analysis to determine the percentage weight loss during a one hour isothermal hold at 450° C. using the following conditions: under nitrogen atmosphere, equilibrate at 35° C., isothermal hold for 5 min, ramp 100° C./minute to 450° C., followed by isothermal hold for 60 min at 450° C. The percentage weight loss of each film sample at 450° C. for 1 hour is reported in Table 4.

TABLE 4

| Formulation | Film Formed From Oligomer No. | $T_{d(5\%)}$ (° C.) | 450° C. Weight Loss (%) |
|---|---|---|---|
| 3 | 3 | 499 | 3.8 |
| 4 | 4 | 499 | 3.9 |
| 5 | 5 | 516 | 3.0 |
| 6 | 6 | 511 | 3.5 |
| 7 | 7 | 517 | 3.3 |
| 8 | 8 | 500 | 2.8 |
| 9 | 9 | 509 | 3.1 |
| 11 | 11 | 496 | 3.4 |
| 12 | EC1 | 530 | 2.2 |
| Comparative 1 | Comparative 1 | 480 | 4.1 |
| Comparative 2 | Comparative 2 | 475 | 4.7 |

As can be seen from the data in Table 4, films formed from the oligomers of the invention show both an improved (lower) weight loss upon 1 hour heating at 450° C. and a higher decomposition temperature ($T_{d(5\%)}$) than the films formed from the comparative oligomers.

What is claimed is:

1. A method comprising: (a) providing a semiconductor device substrate having a relief image on a surface of the substrate, the relief image having a plurality of gaps to be filled; (b) applying a coating composition to the relief image and filling the gaps to provide a coating layer, wherein the coating composition comprises (i) a polyarylene oligomer comprising as polymerized units one or more first monomers having two or more cyclopentadienone moieties and one or more second monomers having an aromatic moiety and two or more alkynyl moieties; wherein the polyarylene oligomer has a $M_w$ of 1000 to 6000 Da, a polydispersity index (PDI) of 1 to 2, and a molar ratio of total first monomers to total second monomers of 1:>1; and (ii) one or more organic solvents; (c) curing the coating layer to form a polyarylene film; (d) disposing a layer of an inorganic hardmask on the polyarylene film; (e) disposing a layer of a photoresist on the inorganic hardmask layer; (f) patterning the photoresist layer; (g) transferring the pattern from the photoresist layer to the polyarylene film; and (h) then transferring the pattern to the semiconductor device substrate.

2. The method of claim 1 wherein the polyarylene oligomer has a $M_w$ of 2000 to 3500 Da.

3. The method of claim 2 wherein the polyarylene oligomer has a PDI of 1.25 to 1.75.

4. The method of claim 1 wherein the polyarylene oligomer has a degree of polymerization of 2 to 3.75.

5. The method of claim 1 wherein the molar ratio of total first monomers to total second monomers is 1:1.01 to 1:1.5.

6. The method of claim 1 further comprising disposing a layer of an organic antireflectant between the hardmask layer and the photoresist layer.

7. The method of claim 1 wherein the polyarylene oligomer further comprises as polymerized units one or more end-capping monomers.

8. The method of claim 1 wherein at least one first monomer has the structure shown in formula (1)

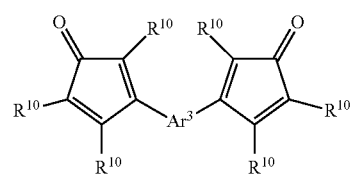

(1)

wherein each $R^{10}$ is independently chosen from H, $C_{1-6}$-alkyl, and optionally substituted $C_{5-20}$-aryl; and $Ar^3$ is an aryl moiety having from 5 to 60 carbons.

9. The method of claim 1 wherein at least one second monomer has the structure shown in formula (5)

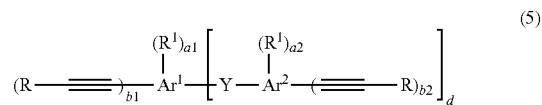

(5)

wherein each $Ar^1$ and $Ar^2$ is independently a $C_{5-30}$-aryl moiety; each R is independently chosen from H, and optionally substituted $C_{5-30}$-aryl; each $R^1$ is independently chosen from $C_{1-10}$-alkyl, $C_{1-10}$-haloalkyl, $C_{1-10}$-hydroxyalkyl, $C_{1-10}$-alkoxy, CN, and halo; each Y is independently a single covalent chemical bond or a divalent linking group chosen from —O—, —S—, —S(=O)—, —S(=O)$_2$—, —C(=O)—, —(C(R$^9$)$_2$)$_z$—, $C_{6-30}$-aryl, and (C(R$^9$)$_2$)$_{z1}$—(C$_{6-30}$-aryl)-(C(R$^9$)$_2$)$_{z2}$—; each R$^9$ is independently chosen from H, hydroxy, halo, $C_{1-10}$-alkyl, $C_{1-10}$-haloalkyl, and $C_{6-30}$-aryl; a1=0 to 4; each a2=0 to 4; b1=1 to 4; each b2=0 to 2; a1+each a2=0 to 6; b1+each b2=2 to 6; d=0 to 2; z=1 to 10; z1=0 to 10; z2=0 to 10; and z1+z2=1 to 10.

10. The method of claim 1 further comprising the step of removing the polyarylene film.

* * * * *